United States Patent
Brown et al.

(10) Patent No.: US 7,113,048 B2
(45) Date of Patent: Sep. 26, 2006

(54) ULTRA HIGH FREQUENCY RING OSCILLATOR WITH VOLTAGE CONTROLLED FREQUENCY CAPABILITIES

(75) Inventors: Richard B. Brown, Salt Lake City, UT (US); Gary D. Carpenter, Austin, TX (US); Fadi H. Gebara, Macomb, MI (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 10/988,463

(22) Filed: Nov. 12, 2004

(65) Prior Publication Data

US 2006/0103478 A1   May 18, 2006

(51) Int. Cl.
*H03B 5/24* (2006.01)
*H03K 3/03* (2006.01)
*H03L 7/099* (2006.01)
(52) U.S. Cl. .......................................... 331/57; 331/34
(58) Field of Classification Search ............. 331/25, 331/34, 57, 177 R
See application file for complete search history.

(56) References Cited

U.S. PATENT DOCUMENTS 6,043,719 A * 3/2000 Lin et al. ..................... 331/57
6,965,273 B1 * 11/2005 D'Souza et al. ............. 331/57

* cited by examiner

*Primary Examiner*—David Mis
(74) *Attorney, Agent, or Firm*—Winstead Sechrest & Minick; Richard Frankeny

(57) ABSTRACT

A pseudo Set/Reset latch circuit is configured with modified NOR or NAND gates wherein one of the series pull-up devices or pull-down devices is removed. A minimum of three pseudo Set/Reset latches may be coupled as a ring oscillator generating an output and a non-skewed complementary output. Additionally, feed-forward inverting stages may be coupled in parallel with inverting paths in the ring oscillator primary path to further increase the frequency range of the ring oscillator. The pseudo Set/Reset latch circuits and the feed-forward inverting stages may be configured with voltage controlled devices that alter the delay of the stages as a means for varying the frequency of the ring oscillator either by varying the current drive of the circuitry driving the output of the latch stages or by varying the conductance of devices coupling between the latch stages. Feedforward inverting stages may comprise pseudo latches or inverter gates.

32 Claims, 14 Drawing Sheets

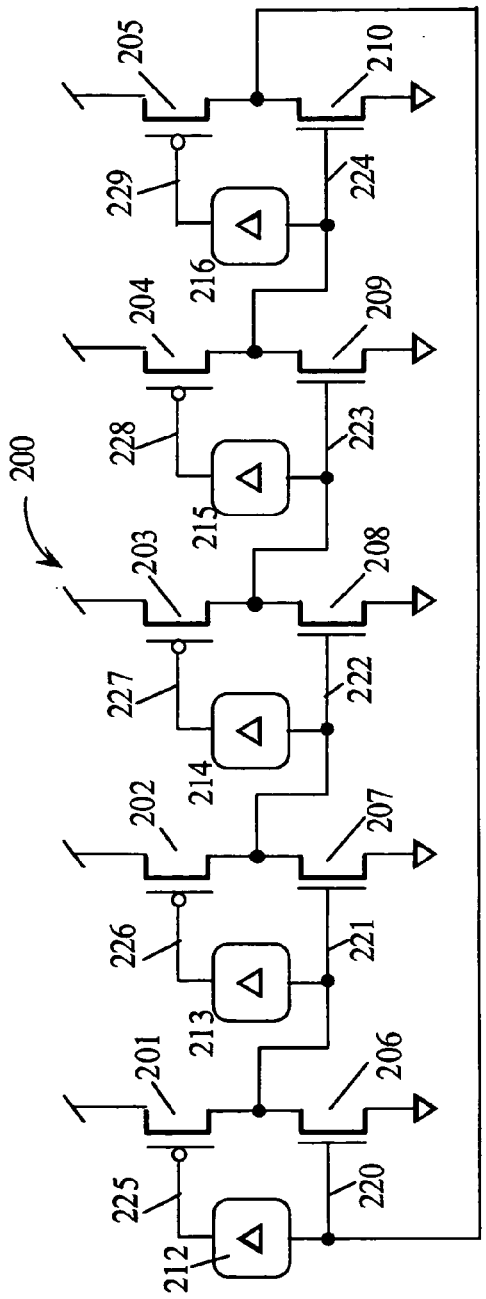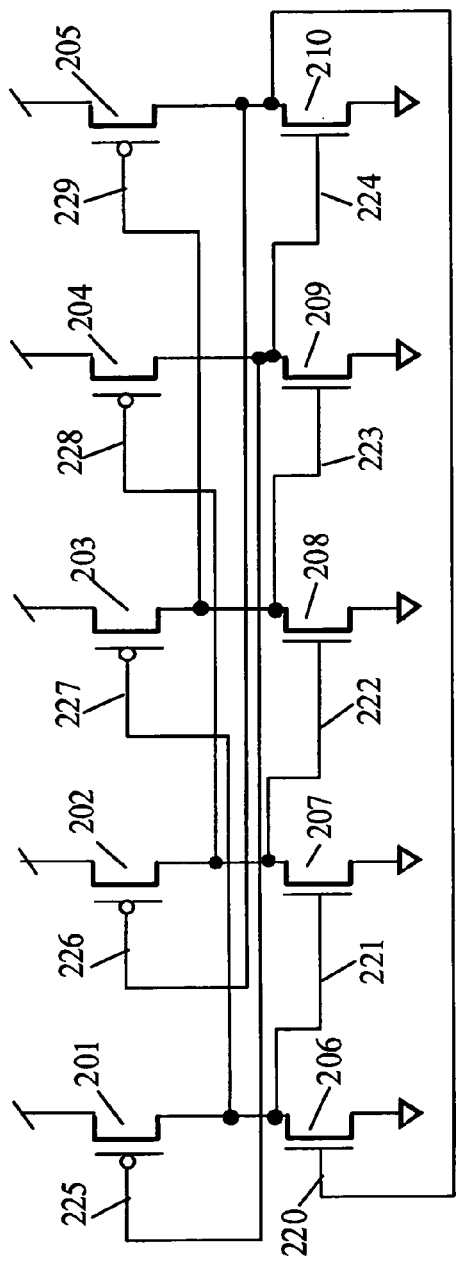
FIG. 2A
(Prior Art)
FIG. 2B
(Prior Art)

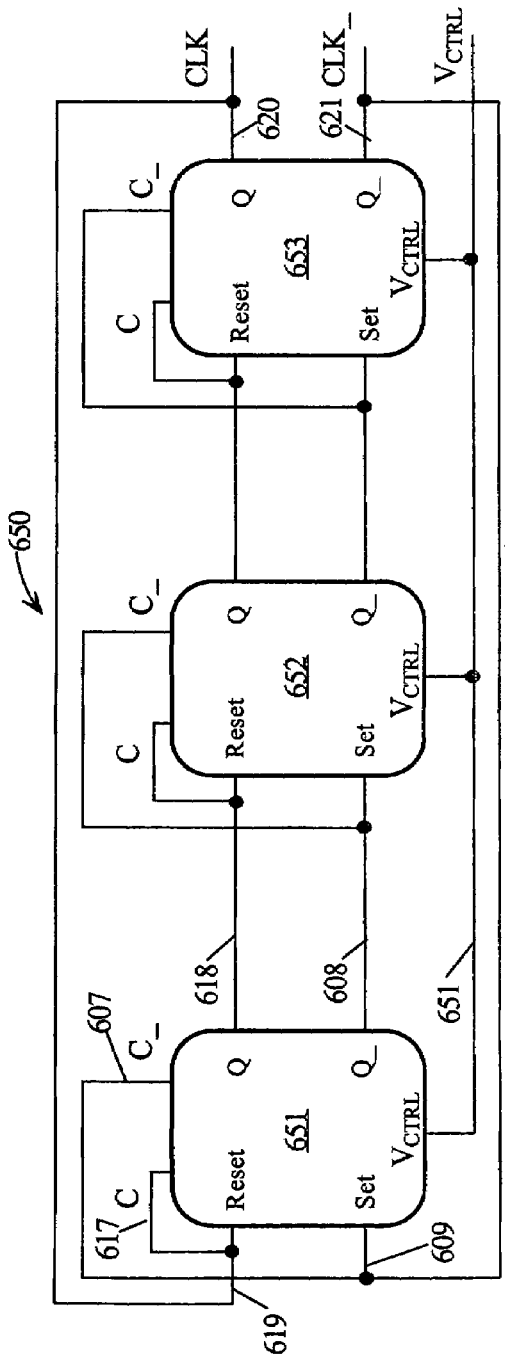
FIG. 6A
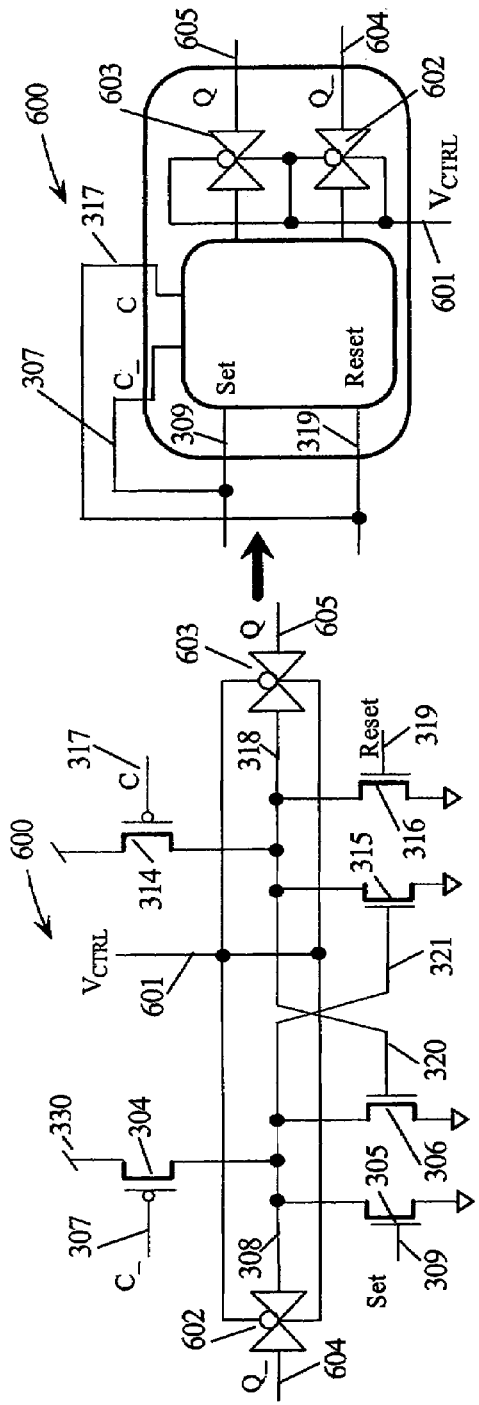
FIG. 6C
FIG. 6B

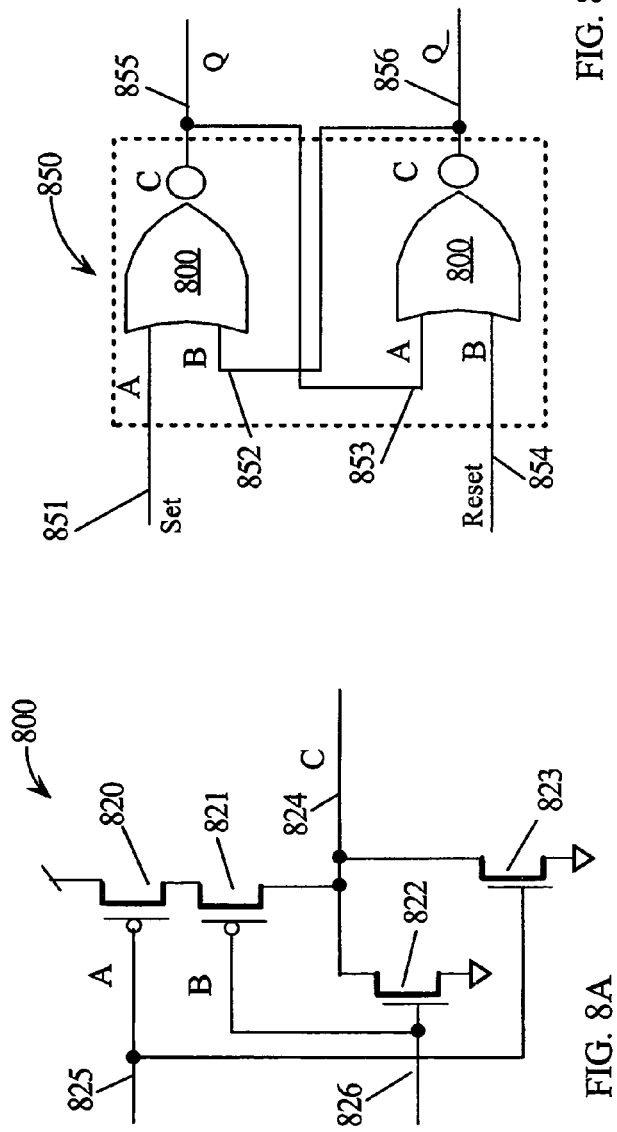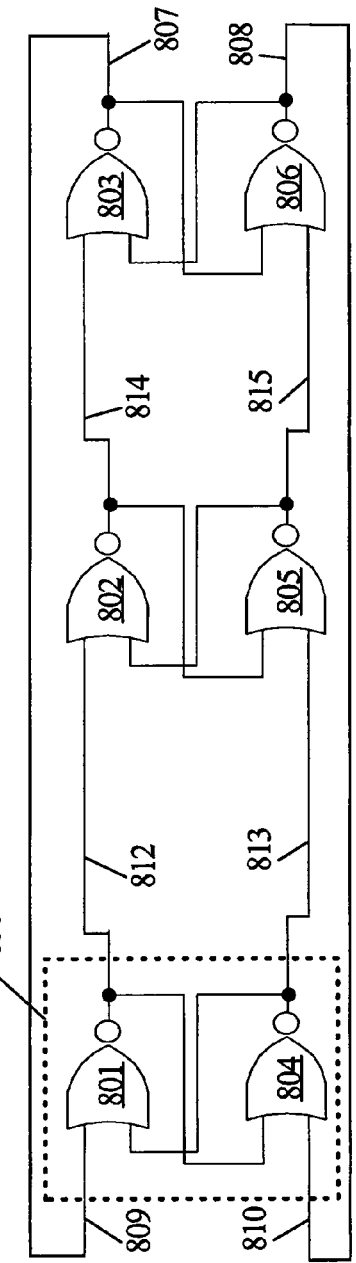
FIG. 8B
FIG. 8C
FIG. 8A

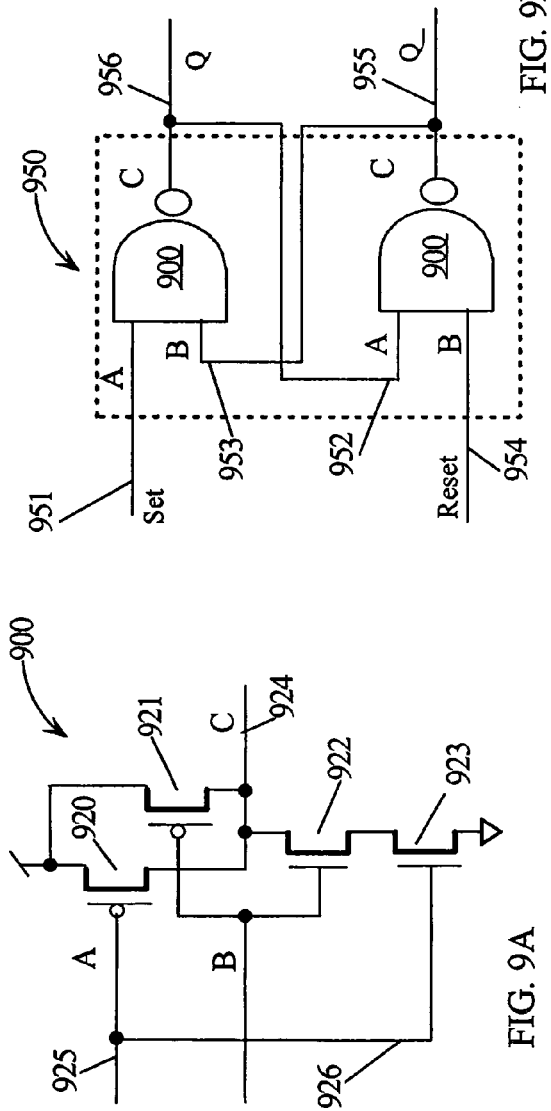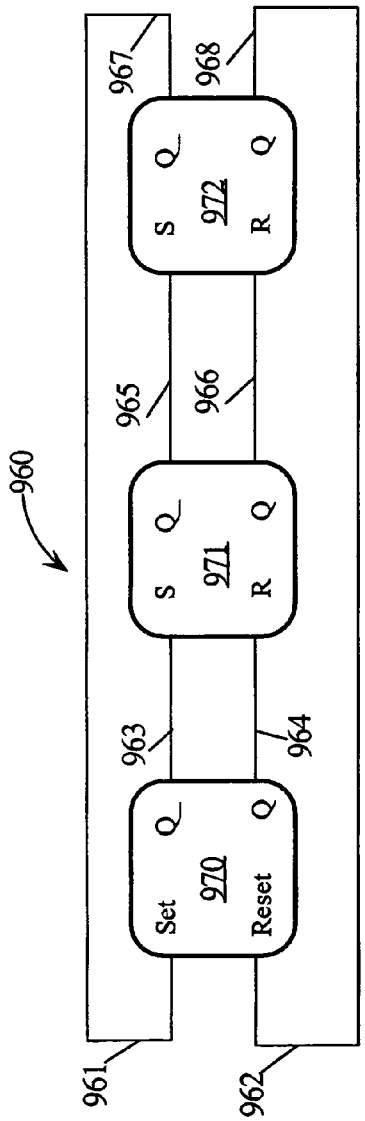
FIG. 9B
FIG. 9A
FIG. 9C

ULTRA HIGH FREQUENCY RING OSCILLATOR WITH VOLTAGE CONTROLLED FREQUENCY CAPABILITIES

TECHNICAL FIELD

The present invention relates in general to complementary metal oxide semiconductor (CMOS) circuits for implementing a very high frequency voltage controlled oscillator (VCO).

BACKGROUND INFORMATION

Phase-locked loops (PLLs) have been widely used in high-speed communication systems because PLLs efficiently perform clock recovery or clock generation at a relatively low cost. Dynamic voltage and frequency scaling is a critical capability in reducing power consumption of power sensitive devices. Scaling, in this sense, means the ability to select high performance with nominal power supply voltages and high frequency clock operation or low performance by reducing the power supply voltage and corresponding the clock frequency. Reducing the system power is usually done when performance is not needed or when running from a limited energy source such as a battery. To allow low power operation, the PLL and other circuits must support very aggressive power/energy management techniques. For the PLL, this means low power operation while supporting key required features such as dynamic frequency scaling, dynamic voltage scaling, clock freezing and alternate low frequency clocking. Dynamic implies that the PLL is able to support changes in the output frequency and logic supply voltage without requiring the system to stop operation or waiting for the PLL clock to reacquire lock.

Using a PLL or delay-locked loop (DLL) has advantages in a battery powered system because a PLL is able to receive a lower reference frequency from a stable oscillator to generate system clock frequencies. A PLL also allows changing the system clock frequency without changing the reference frequency. The prior art has described ways of selecting operating points of voltage and frequency statically, for example, stopping execution while allowing the PLL to frequency lock to a new frequency. This slows system operations and complicates system design.

One of the key circuits in a PLL is a voltage-controlled oscillator (VCO). Circuits in the PLL generate an error voltage that is coupled to the VCO to control the frequency of the VCO output. By frequency dividing the output of the PLL and feeding it back and comparing it to a low frequency crystal-controlled reference clock, a stable high frequency clock may be generated. The VCO in a PLL typically has a range over which the frequency of the VCO may be voltage-controlled. In systems employing frequency scaling, it is desirable to have a voltage-controlled frequency range for normal voltage operation and another voltage-controlled frequency range for low voltage operation without resorting to two VCOs.

The VCO circuit is sometimes considered the most difficult circuit to implement in the PLL especially if ultra high frequencies and low jitter are required. Typically, the VCO is made using five or more inverting elements in a ring oscillator configuration. Standard ring oscillator topologies are relatively simple to design, have low-power, and have robust noise margins. The main drawback to the ring oscillator is that many stages are required to generate high quality signals and many stages lead to lower frequencies.

The requirements for high frequency VCOs are becoming more demanding and in some cases the shortest ring oscillator of three stages may not produce sufficiently high frequencies. A number of circuit topologies have been developed to improve the frequencies possible with the ring oscillator. One such circuit topology is the "classic interpolator" as seen in FIG. 1. Another circuit topology is the "phased oscillator" design shown in FIG. 2. Both of these circuit topologies provide a frequency boost to the standard ring oscillator but both are limited to five or more oscillator stages. In most cases, these oscillator circuit topologies produce frequencies in the range of a standard three stage ring oscillator. Another drawback to these two oscillator circuit topologies is the lack of a complementary output. When clock frequencies become very high, it becomes more difficult to generate complementary signals that are non-skewed.

Therefore, there is a need for a way of configuring a ring oscillator with an odd number of stages of as few as three having voltage controlled frequency capabilities and producing complementary non-skewed signals with symmetrical duty cycles and high signal quality.

SUMMARY OF THE INVENTION

An ultra high frequency oscillator and an ultra high frequency voltage controlled oscillator (VCO) have a dual path ring topology. Two parallel logic circuit paths are configured, one generating a clock signal and the other generating a non-skewed complement of the clock signal. Each logic circuit path has an odd number N of series coupled inverting logic stages, wherein the output of each stage is coupled to an input of a following stage and the output of the last stage is coupled back to the first stage. At least one inverting logic stage of number M (stage M) in the first logic circuit path is cross coupled with the corresponding inverting logic stage of number M in the second logic circuit path, wherein the output of stage M in the first logic circuit path is coupled to an input of stage M in the second logic circuit path and the output of the stage M in the second logic circuit path is coupled to an input of the stage M in the first logic circuit path. The cross-coupling forces the two parallel logic circuit paths to generate non-skewed complementary signals. In one embodiment of the present invention, every one of the N series coupled inverting logic stages in each parallel logic circuit path is a 2-input logic stage wherein one of the inputs is coupled to an output of a preceding one of the N inverting logic stages and one of the inputs is cross-coupled to an output of corresponding inverting logic stage in the parallel logic circuit path. In another embodiment, control circuitry is added to each inverting logic stage to vary the current available to charge logic nodes in response to a control voltage. The control voltage is coupled to the control circuitry in all of the stages in the dual path ring oscillator thereby allowing the delay of each stage to be varied concurrently and thus allowing the frequency of the ultra high frequency VCO to be changed. When every one of the inverting logic stages in any of the dual path ring oscillators are cross-coupled, every output experiences substantially identical loading thereby assuring the generation of a clock signal and a complement of the clock signal that are non-skewed with symmetrical clock periods.

In another embodiment of the present invention, inverting paths in the primary path comprised are coupled in parallel with a feed-forward inverting stage that enables the primary ring to operate at a higher frequency. Because the stages have complementary outputs and inputs, an inverting path in the primary path may comprise any number of stages (e.g., two stages) provided the feed-forward inverting stages span a forward inverting path. Each of the possible two stage inverting paths in the primary path are paralleled with a single feed-forward inverting stage resulting in much higher frequency operation.

In one embodiment of the present invention, the feed-forward stages comprise a pair of inverters that are coupled around inverting paths in the primary path comprising complementary output latches. In another embodiment, the feed-forward stages comprise a pair of voltage controlled (VC) inverters that are coupled around inverting paths in the primary path comprising complementary output VC latches. In yet another embodiment of the present invention, the feed-forward stages comprise complementary output latches that are coupled around inverting paths in the primary path also comprising complementary output latches. In another embodiment, the feed-forward stages comprise VC latches that are coupled around inverting paths in the primary path comprising complementary output VC latches.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A is a circuit diagram of a phased feedback ring oscillator used in the prior art;

FIG. 2B is a circuit diagram illustrating how the phased feedback of FIG. 2A is implemented in a 5-stage inverter ring oscillator;

FIG. 6A is a circuit block diagram of a voltage controlled 3-stage ring oscillator according to embodiments of the present invention;

FIG. 6B is a circuit diagram illustrating another type of voltage control of one of the pseudo dynamic differential latch circuits used in embodiments of the present invention;

FIG. 6C is a circuit block diagram illustrating input and output signals of the voltage controlled pseudo dynamic differential latch circuit of FIG. 6B;

FIG. 8A is a circuit diagram of a 2-input NOR gate;

FIG. 8B is a logic diagram of a Set/Rest latch implemented with two 2-input NOR gates of FIG. 8A;

FIG. 8C is a circuit diagram of a high frequency ring oscillator using three series coupled latch circuits of FIG. 8B;

FIG. 9A is a circuit diagram of a 2-input NAND gate;

FIG. 9B is a logic diagram of a Set/Rest latch implemented with two 2-input NAND gates of FIG. 9A;

FIG. 9C is a circuit diagram of a high frequency ring oscillator using three series coupled latch circuits of FIG. 9B;

DETAILED DESCRIPTION

Figure 1A:
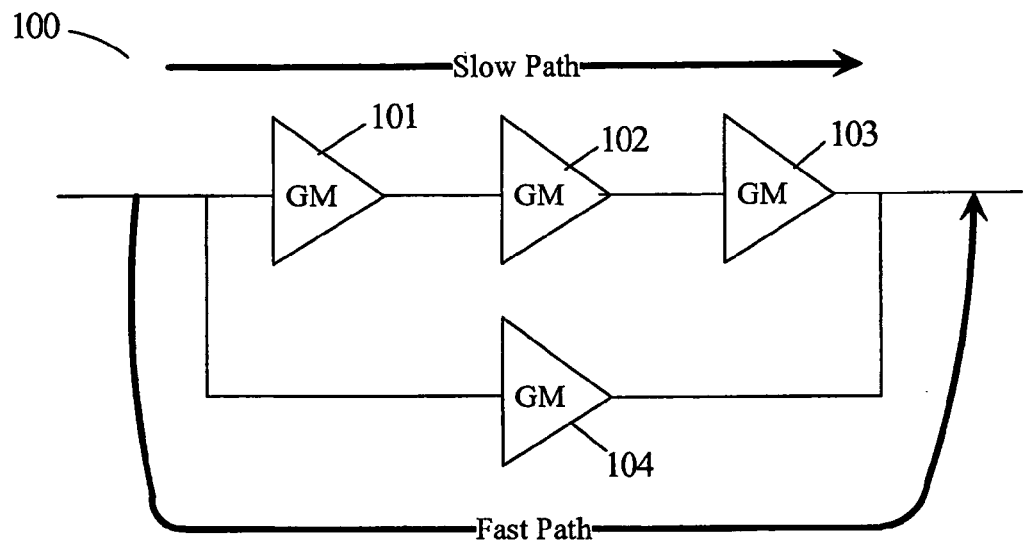
FIG. 1A is a circuit diagram of a slow path and a parallel fast path used in prior art ring oscillators.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

In the following descriptions, non-skewed complementary signals are logic signals where the opposite edge transitions occur with substantially no phase shift. A source of current in the most general sense means the positive and negative potentials of a power supply. Most conventions consider a device conducting current from the positive potential as "sourcing" current and a device conducting current to the negative potential as "sinking" current. In this disclosure, a device conducting current from either power supply potential or a direct connection to either power supply potential may be termed the source of current for simplicity of explanation. If a device is considered the source of current, its structure will be further described relative to the power supply. This allows complementary structures (e.g., NOR and NAND logic gates) to be described using the same language, wherein a "positive true" NAND gate provides a "negative true" NOR function and a "positive true" NOR gate provides a "negative true" NAND function.

Refer now to the drawings wherein depicted elements are not necessarily shown to scale and wherein like or similar elements are designated by the same reference numeral through the several views.

FIG. 1A illustrates an inverting stage 110 comprising a fast path with inverter 114 and a slow path with inverters 111–113. Typically, the fast path inverter 114 has some form of voltage control to set its delay. In this manner, the combined delay through the parallel path may be modulated. A logic transition on the output is the combined response of inverter 113 and 114.

Figure 1B:
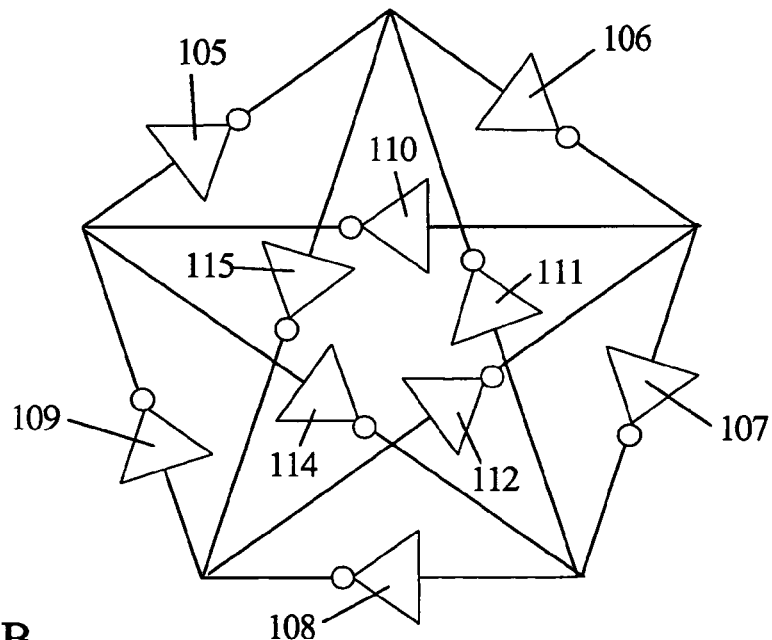
FIG. 1B is a circuit diagram of a 5-stage inverter ring oscillator wherein each group of 3 inverters are bypassed with a single fast path inverter.

FIG. 1B is a circuit diagram of a 5-stage inverter ring oscillator using the parallel fast paths and slow paths of FIG. 1A. Each group of 3 inverters in the outer ring is bypassed by a single inverter in the inner path. Inverters 115–117 are bypassed with inverter 114, inverters 116–118 are bypassed by inverter 115, inverters 117–119 are bypassed by inverter 111, inverters 118–119 and 115 are bypassed by inverter 111, and inverters 119 and 115–116 are bypassed with inverter 112.

FIG. 2A is a circuit diagram of phased feedback 5-stage inverter ring oscillator used in the prior art. PFETS 201–205 and corresponding NFETS 206–211 form the inverting stages wherein the gate drive for the PFETS and the NFETS of the same stage are driven by different signals. Delay blocks 212–216 illustrate that the signals that turn the NFETS ON turn the PFETS OFF a delay time later. Inputs 220–224 are delayed to produce inputs 225–229.

FIG. 2B illustrates connections that implement the topology of FIG. 2A. When an NFET turns ON, then a delayed signal is generated that turns OFF its series coupled PFET at a later time. A logic one transition on the node 220 of NFET 206 turns NFET 206 ON but does not turn PFET 201 OFF until a delay time later (as set by the delay of 212). Therefore, the gate 225 of PFET 201 must be at a logic zero, in which case both PFET 201 and NFET 206 are on at the same time. These two devices will operate in an analog mode during this time period with the transition state on node 221 determined by the relative impedances of the ON devices PFET 201 and NFET 206. When node 221 eventually falls below the threshold voltage of NFET 207, then NFET 207 will turn OFF. In this case, PFET 202 is OFF and will turn ON a delay time later determined by delay block 213. For the delay period of delay block 213, both NFET 207 and PFET 220 are OFF. The alternate "analog" logic one and logic zero states propagate through outputs 222–224 and delay blocks 214–216. The assumed logic one transition of gate 220 propagates as a logic one transition on node 224 which turns ON NFET 211 and causes node 220 to transition to the opposite of the assumed state.

No matter what output state is assumed, traversing through the forward delay path will yield a logic state that changes the assumed state. This is true for P and N channel devices which in each stage are coupled to different gate control signals. This circuit topology will give good results; however, it does not have a phase synchronous complementary output and it is limited to 5 stages because each stage feeds back from 3 stages ahead which requires 4 stages and the overall circuit must be inverting so it requires 5 stages.

A 3-stage ring oscillator may be configured using three inverter stages that feedback the output of the third stage to the input of the first stage. A second 3-stage ring oscillator with the same type of inverters could be used to configure another oscillator with the same frequency to provide the complementary output but the phasing of the two oscillator signals would be unknown. One way to make a ring oscillator using three 2-input NOR gates is to couple one of the inputs to each stage to a logic zero. Alternatively, one input of each 2-input NOR stage in such a ring oscillator may be used to synchronize the oscillator with another like 3-stage ring oscillator to achieve the desired non-skewed output and complementary output.

FIG. 8A is a circuit diagram of a standard 2-input NOR gate 800 made with PFETs and NFETs. Input 825 is coupled to the gates of PFET 820 and NFET 823, and input 826 is coupled to the gates of PFET 821 and NFET 822. If either NFET 822 or NFET 823 is ON, then output 824 is pulled-down (discharged) to a logic zero. Likewise, if both PFET 820 and PFET 821 are ON, then output 824 is pulled-up (charged) to a logic one.

FIG. 8B is a logic diagram of a Set/Reset latch 850 configured by cross-coupling two NOR gates 800 as shown. Input 851 is arbitrarily labeled as the Set input corresponding to non-inverting output Q 856. When input 851 is a logic one, output Q 856 is set to a logic one if input 854 is a logic zero. Therefore, input 854 is labeled as the Reset input corresponding to inverting output Q_855. Output 856 is cross-coupled to input 852 and output 855 is cross-coupled to input 853.

FIG. 8C illustrates a ring oscillator 860 configured using NOR gates 801–806. Ring oscillator 860 may be thought of as two parallel 3-stage ring oscillator paths configured from 2-input NOR gates and cross-coupled wherein each set of two NOR gates form a Set/Reset latch 850. The first oscillator path comprises NOR gates 801–803 which generates a clock signal at output 807 and the second oscillator path comprises NOR gates 804–806 which generates a complementary clock signal at output 808 that is the complement of the clock signal at output 807. Output 807 couples back to input 809 of NOR gate 801 and output 808 couples back to input 811 of NOR gate 804. Output 812 of NOR gate 801 is coupled to NOR gate 802 and to the second input of NOR gate 804. Likewise, output 813 of NOR gate 804 is coupled to NOR gate 805 and to the second input of NOR gate 801. Input 811 is the Set input to the latch 850 formed by NOR gates 801 and 804 and input 809 is the Reset input.

To explain the operation of oscillator 860, assume input 810 is a logic one causing output 813 to transition to a logic zero. Also assume input 809 is a logic zero causing output 812 to transition to a logic one. If the Set input (coupled to output 813) is a logic one and the Reset input (coupled to output 812) is a logic zero, then the latch formed by NOR gates 802 and 805 is Reset and its output 814 transitions to a logic zero and its complementary output 815 transitions to a logic one. Likewise, if the Set input (coupled to output 814) is a logic one and the Reset input (coupled to output 815) is a logic zero, then the latch formed by NOR gates 803 and 805 is Set and its output 807 transitions to a logic zero and its complementary output 808 transitions to a logic one. When outputs 807 and 808 are fed back to inputs 809 and 810 respectively, they assert opposite states to those assumed, thus the ring oscillator 860 will oscillate as desired generating both a non-inverting output Q 807 and a complementary output Q_808.

While it has been shown that the ring oscillator configuration 860 oscillates and generates two complementary phases, the question arises as to the transition timing of the output 807 relative to the complementary output 808 (are the output and complementary output non-skewed). To answer this question, assume output 807 transitions to a logic one. Since output 808 is the complementary output, it either has already transitioned to a logic zero or it has yet to transition to a logic zero. If we assume output 808 has not transitioned to a logic zero, then it is still at a logic one in which case it would not allow output 807 to transition to a logic one. Therefore, output 808 cannot still be at a logic one if we are postulating that output 808 is transitioning to a logic one. If we assume output 808 has already transitioned to a logic zero before output 807, then output 815 would have already transitioned to a logic one as output 808 is assumed to be a logic zero. This means that the transition on output 815 is ahead of the transition on output 814. Likewise, the transition on output 813 must be ahead of the transition on output 812. However, we have assumed that output 808 is still a logic one which would make output 813 lag output 812 which is counter to our assumption. Therefore, the only logical conclusion is that output 807 and 808 are complementary and in-phase. The cross-coupling has forced the ring oscillator path comprising NOR gates 801–803 to synchronize with the oscillator path comprising NOR gates 804–806 while producing an output and a complementary output that are non-skewed.

FIG. 9A is a circuit diagram of a standard 2-input NAND gate 900 made with PFETs and NFETs. Input 925 is coupled to the gates of PFET 920 and NFET 923 and input 926 is coupled to the gates of PFET 921 and NFET 922. If NFET 922 and NFET 923 are ON, then output 924 is pulled-down (discharged) to a logic zero. Likewise, if PFET 920 or PFET 921 are ON, then output 924 is pulled-up (charged) to a logic one.

FIG. 9B is a logic diagram of a Set/Reset latch 950 configured by cross-coupling two NAND gates 900 as shown. Latch 950 is considered "negative" logic in that a logic zero is considered a "logic true" state. Input 951 is arbitrarily labeled as the Set input corresponding to non-inverting output Q 956. When input 951 is a logic zero, output Q 956 is set to a logic one if input 954 is a logic one. Therefore, input 954 is labeled as the Reset input corresponding to inverting output Q_955. Output 956 is cross-coupled to input 952 and output 955 is cross-coupled to input 953.

FIG. 9C illustrates a ring oscillator 960 configured using 3 latches 950 as shown in FIG. 9B and labeled 970–972. It was shown relative to FIG. 8C that an odd number (e.g., three) series coupled Set/Reset latches will oscillate. The only difference is that the Set and Reset inputs (e.g., 951 and 954) are "negative" true. The NAND gates (not shown) in latches 970–972 also form two parallel logic circuit paths like the NOR gates of FIG. 8C. Assume Set input 961 is a logic zero and Reset input 962 is a logic one for latch 970. Therefore, output Q 963 is set to a logic one and output Q_964 is set to a logic zero. Since the Reset input of latch 971 is a logic zero and the Set input of latch 971 is a logic one, output Q_966 transitions to a logic one and output Q 965 transitions to a logic zero. The output Q 969 of latch 972 transitions to a logic one when output Q 965, coupled to its Set input, is a logic zero. Likewise, output Q_968 transitions to a logic zero. Outputs Q 969 and Q_968 are fed back to Set input 961 and Reset input 962, respectively. Since the asserted logic states on inputs 961 and 962 are the opposite to what was assumed, ring oscillator 960 oscillates as desired.

Figure 3A:
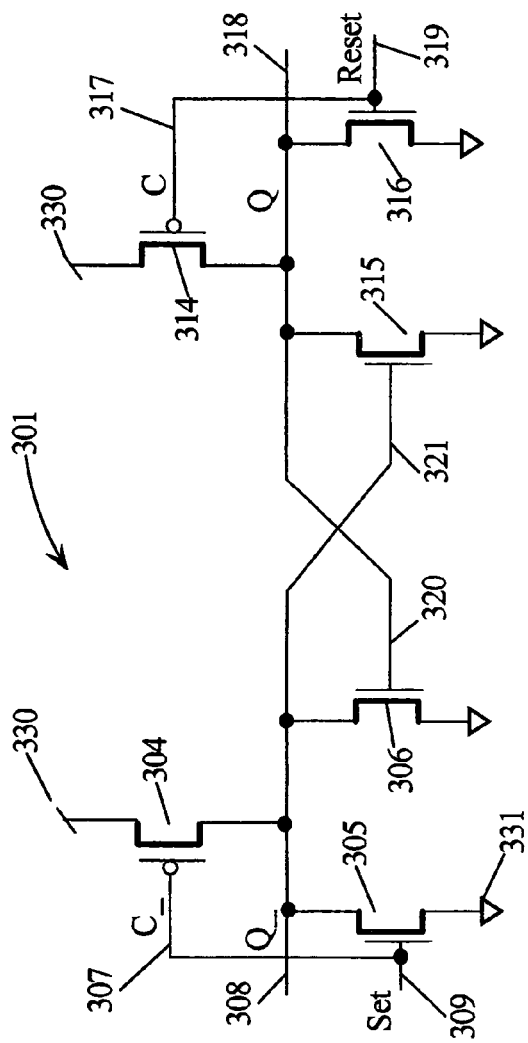
FIG. 3A is a circuit block diagram of a 3-stage ring oscillator according to embodiments of the present invention.

FIG. 3A is a circuit diagram of modified NOR gates cross-coupled to configure what is termed a "pseudo" Set/Reset latch 301 used to implement a dual logic circuit path ultra high frequency ring oscillator according to embodiments of the present invention. NFETs 305 and 306 form an open drain NOR gate with PFET 304 as an active pull-up. The gate of PFET 304 is identified as C_307 and is coupled to the gate of NFET 305 which is identified as the Set input 309 to pseudo latch 301. The gate 320 of NFET 306 is coupled to output Q 318 and the gate 321 of NFET 315 is coupled to output Q_308. Likewise, the gate of PFET 314 is identified as C 317 and is coupled to the gate of NFET 316 which is identified as Reset 319. Pseudo latch 301 would operate as a normal Set/Reset latch only if C 317 and C_307 are coupled to ground voltage potential 331. However, in embodiments of the present invention the gates (C_307 and C 317) of active pull-up PFET 304 and PFET 314 are coupled to Set input 309 and Reset input 319, respectively. Because the pseudo latch 301 is used in a circuit specifically configured to form a ring oscillator, one of the two series PFETS present in the pull-up of an unmodified NOR gate (see FIGS. 8A–8C) may be eliminated.

Figure 3B:
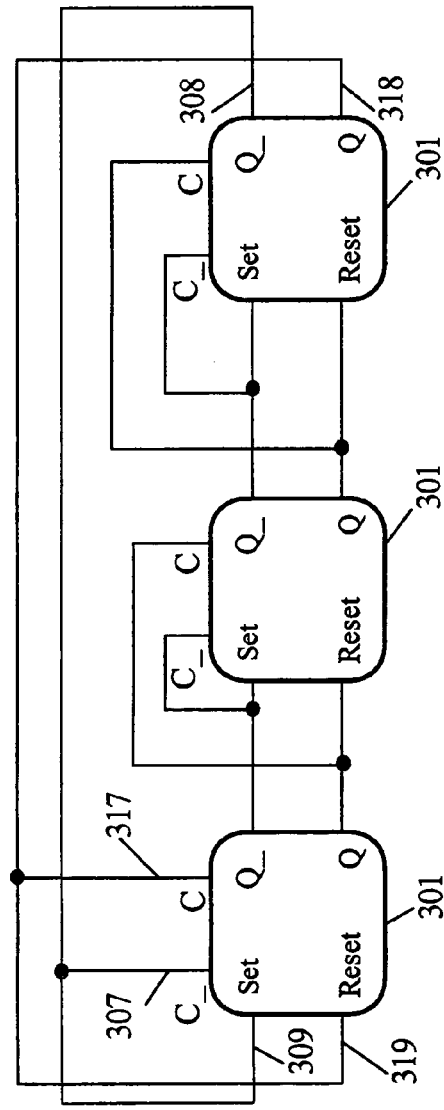
FIG. 3B is a circuit diagram of one of the pseudo dynamic differential latch circuits used in embodiments of the present invention.

FIG. 3B is a block diagram of 3 pseudo latches 301 connected to make a dual logic circuit path ring oscillator 300 according to embodiments of the present invention. Each of the latches 301 has circuitry according to FIG. 3A. C_317 is coupled to Set input 309, C 307 is coupled to Reset input 319. The outputs Q_318 and Q 308 of each pseudo latch 301 are connected to the Set input 309 and the Reset input 319, respectively, of the following adjacent pseudo latch 301 wherein the outputs of the last stage coupled back to the inputs of the first stage.

Figure 4:
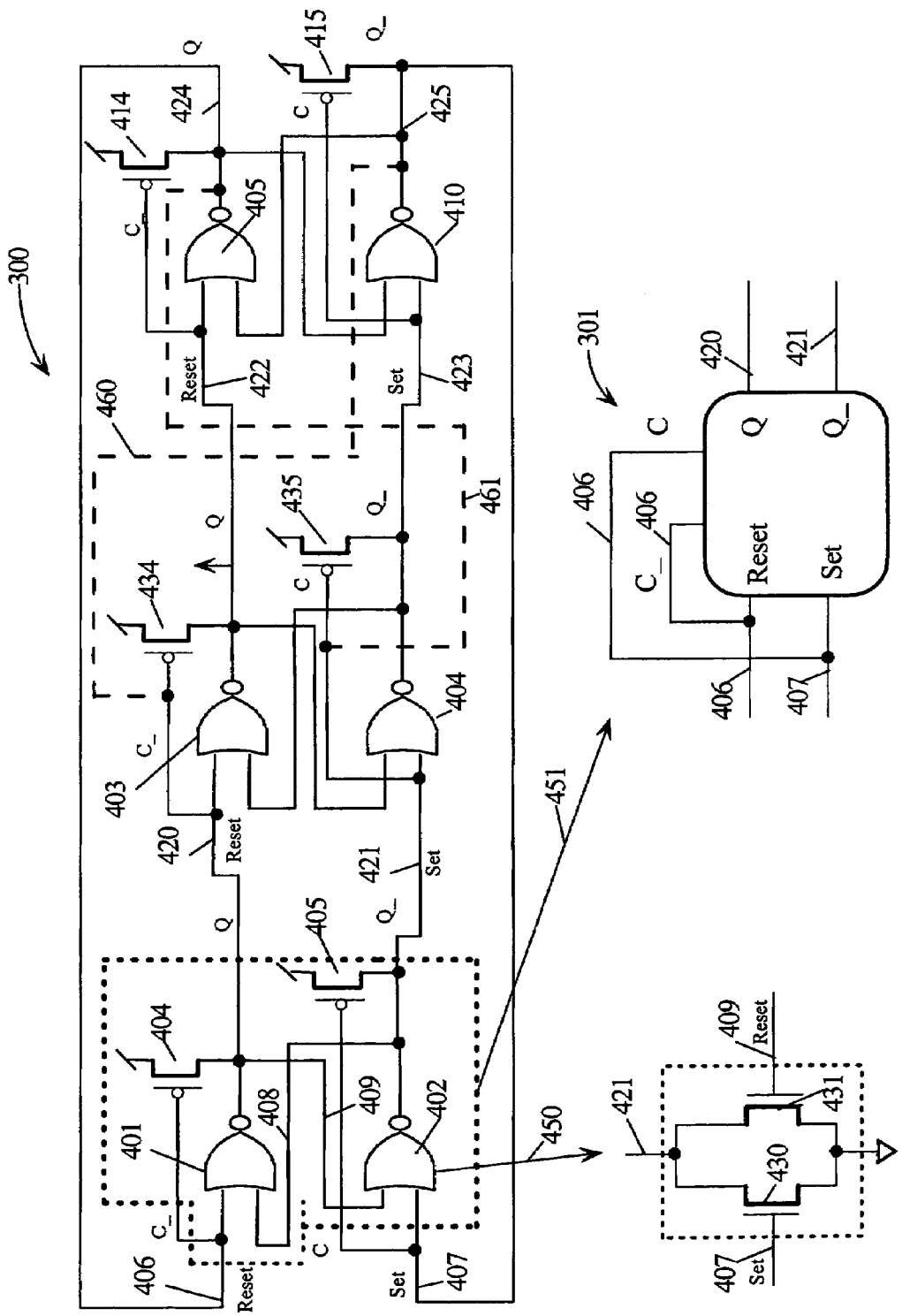
FIG. 4 is a circuit diagram of the 3-stage ring oscillator illustrating the connection between transistor elements.

FIG. 4 is a detailed circuit diagram of the ring oscillator 300 used to describe how the circuit configuration of FIG. 3B using pseudo latches 301 is guaranteed to oscillate. Also described is the operation without one of the series pull-up PFET devices in the modified NOR gates used to make the cross-coupled pseudo latches 301. Arrow 450 points to an exploded view of the open drain NOR gate 402. NFETs 430 and 431 have common drains forming output node 411. The gate of NFET 430 is coupled as Set input 407 and the gate of NFET 431 is coupled as Reset input 409. A dotted box is drawn around the circuit elements included in pseudo latch 301 explained relative to FIGS. 3A and 3B. It is understood that normal operation assumes the outputs (e.g., Q 420 and Q_421) alternately assert complementary logic states. The question to be answered is whether these outputs can assume the same logic state (both concurrently a logic one or logic zero) that are stable.

To determine whether concurrent logic one states are stable, assume outputs Q 420 and Q_421 both are at a logic one. Output 421 is cross coupled to input 408 of NOR gate 401. If output 421 is a logic one, then NOR gate 401 would assert a logic zero at output Q 420. If Q_421 is a logic one, then Set input 407 must be a logic zero to turn ON PFET 405. When Q 420 goes to a logic zero, the logic state of Q_421 is consistent with the inputs to NOR gate 402 and Q 420 and Q_421 assert complementary logic states. Therefore, the outputs (e.g., Q 420 and Q_421) of pseudo latches 301 interconnected as shown in FIG. 4 cannot assume concurrent logic one states that are stable.

Optional connections 460 and 461 are shown dotted as the connections to the gates of PFETs 434 and 435, respectively. Normally, the gates of PFETs 434 and 435 are connected as shown to inputs Reset 420 and Set 421, respectively. However, the gates of active loads (e.g., PFETs 434 and 435) may be connected to any input that has asserted logic states whose transitions are in phase with but leading those of their normal connection. As an example, the gate (C_) of PFET 434 is normally connected to Reset 420. PFET 434 is turned ON following a transition to a logic zero on Reset 420. Since Reset 420 and Set 421 are complementary non-skewed logic signals, when Reset 420 transitions to a logic zero Set 421 must transition to a logic one. For Set 421 to transition to a logic one, Reset 406 must have transitioned to a logic zero one stage delay earlier and likewise Set 407 must have transitioned to a logic zero one stage delay earlier. Set 407 is the same as output 425, therefore output 425 meets the requirements for an input (optional connection 460) that has phase transitions that are in phase with but leading the phase transitions of normal connection Reset 420. A similar argument may be presented for the optional connection (461) of the gate of PFET 435 to output 424. PFETs 404–405 and 424–415 would be similarly optionally connected to provide equally loaded ring oscillator stages. Either the normal or optional configuration of the ring oscillator 300 provides complementary non-skewed outputs, however, there may be differences in attainable oscillator frequencies between the two configurations.

To answer whether concurrent logic zero states are stable, assume outputs Q 420 and Q_421 both are at a logic zero. If this were the case, then the Reset input to NOR gate 403 is a logic zero turning ON PFET 412 thereby driving output Q 422 to a logic one. Likewise, the Set input to NOR gate 404 would be a logic zero thereby turning ON PFET 413 driving Q_423 to a logic one. However, the cross-coupling of the outputs to the inputs of NOR gates 403 and 404 assures one of the outputs (Q 422 or Q_423) must be at a logic zero which is inconsistent with the assumption that both outputs Q 420 and Q_421 both are at a logic zero. Therefore, the outputs (e.g., Q 420 and Q_421) of pseudo latches 301 interconnected as shown in FIG. 4 cannot assume concurrent logic zero states that are stable.

To determine if the ring oscillator 300 will oscillate, assume Reset input 406 is a logic zero and Set input 407 is a logic one. The logic zero on Reset input 406 turns ON PFET 404 which drives a logic zero on output Q 421 of NOR gate 402 via the cross coupled input. Therefore, output Q 420 is a logic one and output Q_421 is a logic zero. Since Q 420 is the Reset input to the pseudo latch comprising NOR gates 403 and 404 and PFETS 412 and 413, output Q 422 transitions to a logic zero and Q_423 transitions to a logic one. Since output Q 422 is the Reset input to the pseudo latch comprising NOR gates 405 and 411 and PFETS 414 and 415, output Q 424 transitions to a logic one and Q_425 transitions to a logic zero. Output Q 424 and output Q_425 feed back to Reset input 406 and Set input 407, respectively. These logic states are complementary opposites to what was initially assumed, therefore, the circuit oscillates as predicted. Ring oscillator 300 oscillates like ring oscillator 860 which uses fully functional Set/Reset latches as illustrated in FIG. 8A. Each pseudo latch has one less PFET per NOR gate than the fully functional NOR gates 800 used in ring oscillator 860.

Figure 5A:
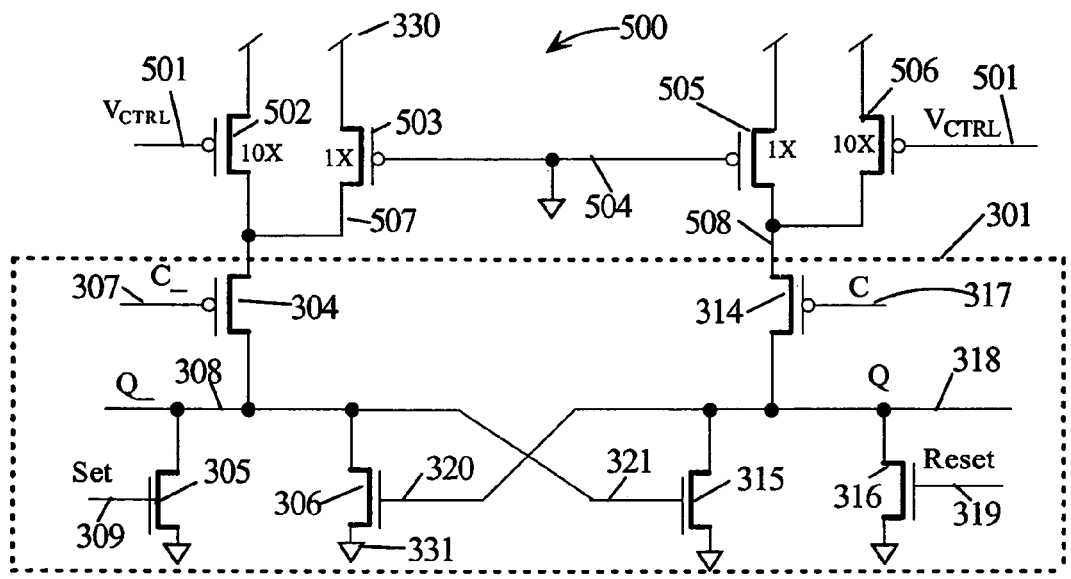
FIG. 5A is a circuit diagram illustrating voltage control of one of the pseudo dynamic differential latch circuits used in embodiments of the present invention.

FIG. 5A is a circuit diagram of a pseudo latch 500 with added circuit elements to make the delay through each parallel logic circuit path of pseudo latch 500 voltage variable enabling an ultra high frequency VCO according to embodiments of the present invention. The dotted line identifies the devices that form a pseudo latch with the same circuit topology as described relative to FIG. 3A except that PFETS 502–503 are coupled to the source of PFET 304 in place of a power supply voltage potential 330. Likewise, PFETS 505 and 506 are coupled to the source of PFET 314 in place of power supply voltage potential 330. Since the modified NOR gates in pseudo latch 301 do not use the second series connected PFET normally found in full function active NOR gates, PFETS 502 and 503 and PFETS 505 and 506 may be added as control elements while keeping the same number of devices between voltage potential 330 and ground potential 331. When PFET 304 is turned ON, PFETS 502 and 503 provide current to charge output Q_308. Likewise, when PFET 314 is turned ON, PFETS 505 and 506 provide current to charge output Q 318. PFET 503 is a small device typically one tenth the size of PFET 502 that provides a small non variable active load. PFET 503 prevents an oscillator configured with a pseudo latch 500 from a non controlled turn OFF. PFETS 503 and 505 are biased ON by coupling their gates to ground potential at node 504. Since PFETS 503 and 505 are small devices, they have a high relative resistance and "starve" the pull-up devices PFETS 304 and 314. Large PFETS 502 and 506 have their gates coupled to control voltage $V_{CTRL}$ 501. By varying $V_{CTRL}$ 501 from the voltage potential of power connection 330 to the ground voltage potential 331, PFETS 502 and 506 provide increasing variable current to PFETS 304 and 314 thereby decreasing the delay in charging outputs Q 318 and Q_308. In this manner, a ring oscillator made with voltage variable pseudo latches 500 may be used to configure an ultra high frequency voltage controlled oscillator according to embodiments of the present invention. The dual circuit (NAND) for implementing a pseudo latch like pseudo latch 500 is not shown but is considered within the scope of the present invention. For example, the NAND implementation would substitute the usage of the PFETS for the NFETS and visa versa and flip the power supply connections. A transistor level NAND is shown in FIG. 9; however, the NAND configuration for a pseudo latch 500 with voltage control of delay is not shown but understood by those of ordinary skill in the art to be within the scope of the present invention.

Figure 5B:
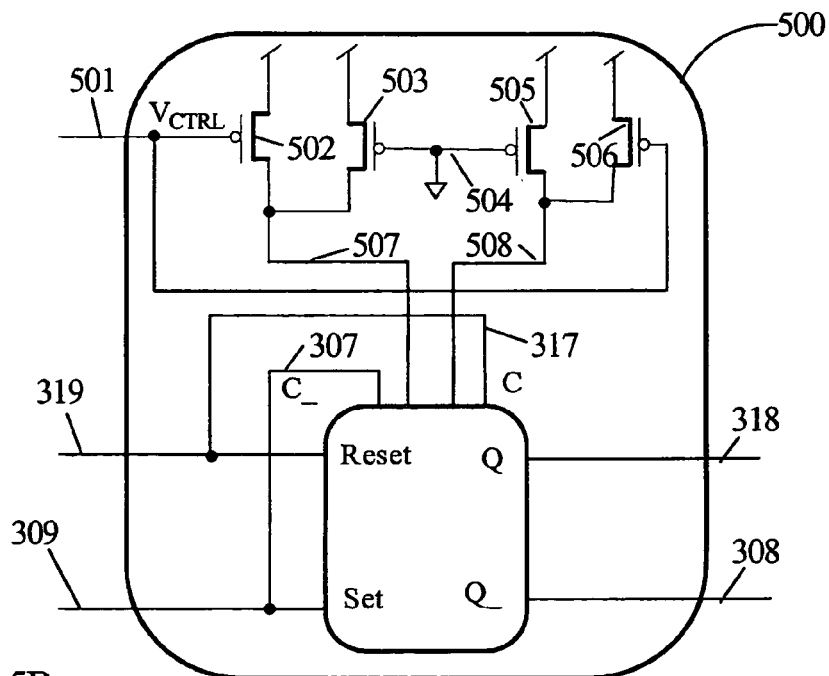
FIG. 5B is a circuit block diagram illustrating input and output signals of a voltage controlled pseudo dynamic differential latch circuit used in embodiments of the present invention.

FIG. 5B is a circuit diagram of a latch 500 that has Reset input 319, Set input 309, output Q 318 and complementary output Q_308 and voltage control input $V_{CTRL}$ 501. The voltage control circuitry comprising PFETS 502–506 with outputs 507 and 508 is shown inside the box defining pseudo latch 500 with voltage control input $V_{CTRL}$ 501.

FIG. 6A illustrates a ring oscillator 650 configured using 3 voltage controlled latches 500 (See FIGS. 5A and 5B) identified as latch 651, 652, and 653. All the nodes are not labeled for simplicity. Exemplary latch 651 illustrates how the inputs, outputs, and control signals are connected. Latches 652 and 653 are similarly connected. Relative to latch 651, Reset input 619 is coupled to C 617 and Set input 609 is coupled to C_607. The output Q 618 is coupled to the following Reset input to latch 652. Likewise, the output Q 618 is coupled to the following Set input to latch 652. Output 620 generates the VCO output and output 621 generates the complementary VCO output. All of the voltage control inputs are coupled in common and to $V_{CTRL}$ 651.

FIG. 6B is an alternate circuit topology for adding voltage control to a ring oscillator configured using pseudo latches as described relative to FIG. 3A. Complementary pass gates 602 and 603 are added to each output 308 and 318. These pass gates are configured using parallel PFET and an NFET with their gates coupled to $V_{CTRL}$ 601. The conductivity of pass gates 602 and 603 are varied with a control voltage applied to $V_{CTRL}$ 601 which modulates the current available to charge the input of a following stage. This allows the delay of a ring oscillator, formed as shown in FIG. 6A, to be varied and thus allows the frequency of the ring oscillator to be varied.

FIG. 6C illustrates a voltage controlled pseudo latch 601 using pass gates 602 and 603 as the control devices. Either pseudo latch 601 or pseudo latch 500 may be used in the ring oscillator circuit topology 650 of FIG. 6A.

Figure 10A:
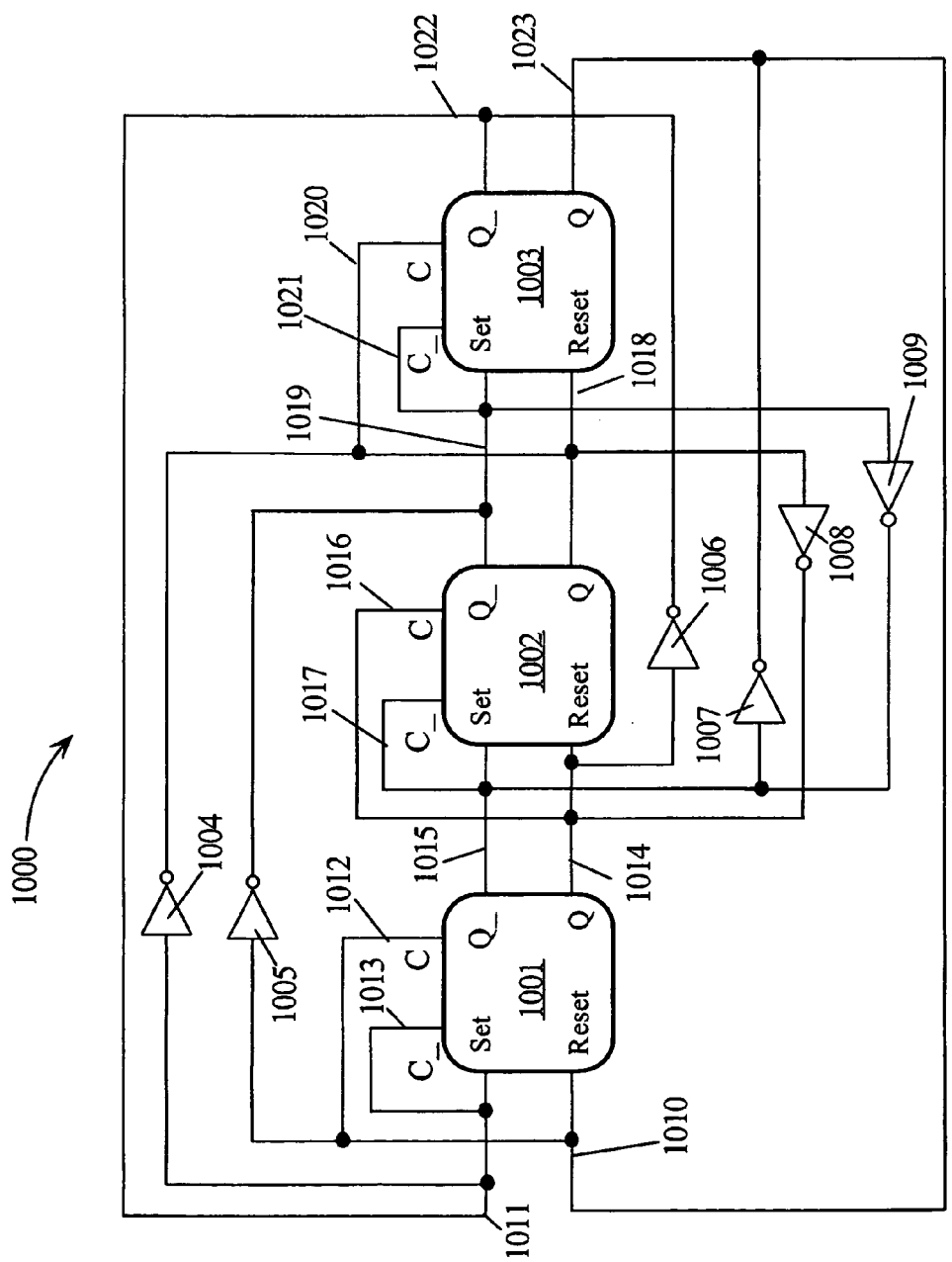
FIG. 10A is a circuit diagram of a high frequency ring oscillator according to embodiments of the present invention using series coupled latch circuits of FIG. 8B or FIG. 9B and feed-forward inverters.

FIG. 10A is a circuit diagram of a high frequency ring oscillator 1000 using series coupled latches of FIG. 3A as latches 1001–1003 and feed-forward inverters 1004–1009. The primary path comprising latches 1001–1003 operates as discussed relative to the ring oscillator of FIG. 3B. Additionally, the feed-forward inverters 1004–1009 are coupled in pairs such that each feed-forward inverter 1004–1009 spans another inverting path. For example, if Reset 1010 transitions to a logic one, Q_1015 transitions to a logic one setting latch 1002 causing Q_1019 to transition to a logic zero. Inverter 1005 spans from Reset 1010 to the Q_1019, thus an inverting path. Likewise, when Set 1011 transitions to a logic one, Q 1014 transitions to a logic one resetting latch 1002 causing Q 1018 of latch 1002 to transition to a logic zero, again an inverting path. Thus, inverter 1004 spans the inverting path from Set 1011 to Q 1018. Inverter pairs 1006–1007 and 1008–1009 also span forward inverting paths. The ring oscillator 1000 of FIG. 10A operates in the same fashion as the ring oscillator of FIG. 2B except it does so with true differential signaling. The outputs 1022 and 1023 couple back to inputs 1011 and 1010, respectively. The feed-forward inverters (e.g., 1004–1009) may be connected to span additional forward inverting paths. Since the latches 1001–1003 have both inverting and non-inverting outputs, a forward inverting path may be contained in an even or odd number of physical stages (latches 1001–1003). Since ring oscillator 1000 only has three stages, only one FF connection comprising more than one stage is possible. However, if ring oscillator 1000 had five stages, multiple connections would be possible. Exemplary inverters 1004 and 1005 are normally connected as shown since the path from input 1011 to output Q 1018 is a forward inverting path and the path from 1010 to output Q_1019 is a forward inverting path. Similarly, if input 1011 transitions to a logic one, Reset 1014 transitions to a logic one and Set 1019 transitions to a logic one and Q_1022 transitions to a logic zero. Therefore, the forward path from input 1011 to Q_1022 is a forward inverting path and the forward path for input 1010 to Q 1023 is a forward inverting path.

Figure 10B:
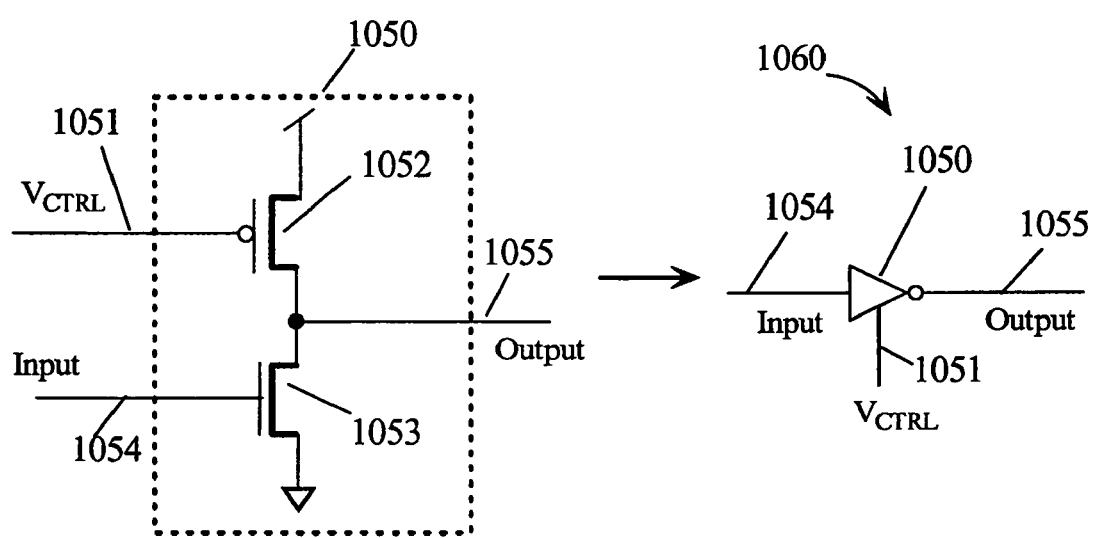
FIG. 10B is a circuit diagram of an inverter where the pull-up device operates as a voltage controlled (VC) current source.

FIG. 10B is a circuit diagram of a voltage controlled (VC) inverter 1050 used in embodiments of the present invention. VC inverter 1050 is shown as schematic symbol 1060. VC inverter 1050 comprises a PFET 1052 and an NFET 1053 as in a standard CMOS inverter. However, the gate of the PFET 1052 is coupled to a control voltage $V_{CTRL}$ 1051. $V_{CTRL}$ 1051 is varied to modify the current in PFET 1052 thus speeding or slowing the response of transitions at Output 1055. Input 1054 is the normal logic input that determines the state on Output 1055. Symbol 1060 is used to designate a VC inverter in the following FIG. 10C.

Figure 10C:
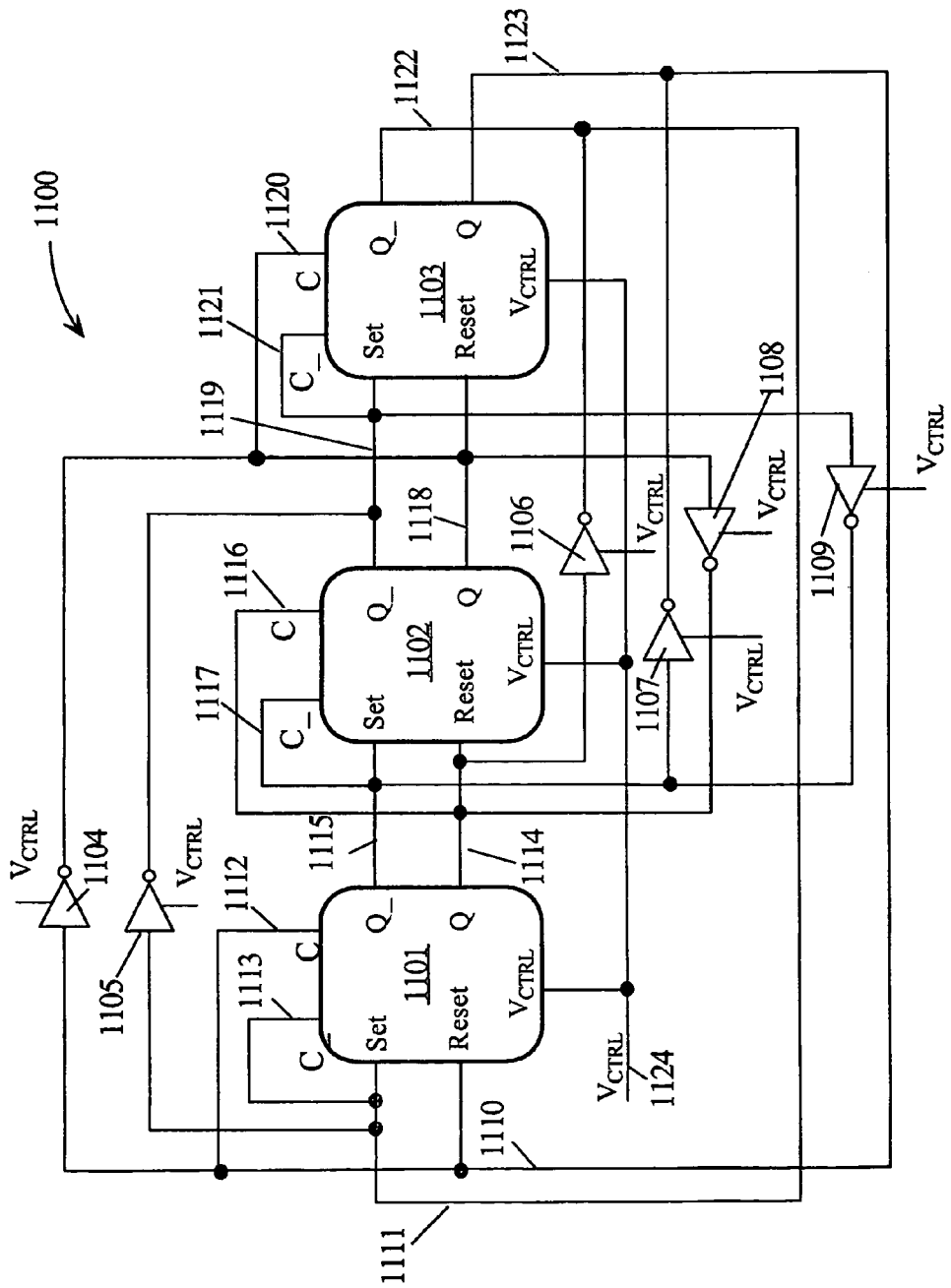
FIG. 10C is a circuit diagram of a VC high frequency ring oscillator according to embodiments of the present invention using series coupled latch circuits of FIG. 5B or FIG. 6C and voltage controlled feed-forward inverters of FIG. 11B.

FIG. 10C is a circuit diagram of a VC high frequency ring oscillator 1100 using series coupled VC latches of FIG. 5B or 6B as VC latches 1101–1103 and feed-forward VC inverters 1104–1109. The operation of the VC inverters are explained relative to FIG. 10B. Each VC inverter 1104–1109 has a control input coupled to $V_{CTRL}$ 1124. The primary path comprising VC latches 1101–1103 operates as discussed relative to the ring oscillator of FIG. 5B or FIG. 6B. Additionally, the feed-forward VC inverters 1104–1109 are coupled in pairs such that each feed-forward VC inverters 1104–1109 spans another inverting path. For example, if Reset 1110 transitions to a logic one, Q_1115 transitions to a logic one setting latch 1102 causing Q_1119 to transition to a logic zero. VC inverter 1115 spans from Reset 1110 to the Q_1119, thus an inverting path. Likewise, when Set 1111 transitions to a logic one, Q 1114 transitions to a logic one resetting latch 1102 causing Q 1118 of latch 1112 to transition to a logic zero, again an inverting path. Thus, VC inverter 1104 spans the inverting path from Set 1111 to Q 1118. VC inverter pairs 1106–1107 and 1108–1109 also span forward inverting paths. The ring oscillator 1110 of FIG. 11A operates in the same fashion as the ring oscillator of FIG. 2B except it does so with true differential signaling and voltage control of frequency. The outputs 1122 and 1123 couple back to inputs 1111 and 1110 respectively. When control voltage $V_{CTRL}$ 1124 is varied, the delay through the voltage controlled primary and parallel paths vary thus modulating the frequency of the ring oscillator 1100.

Figure 11A:
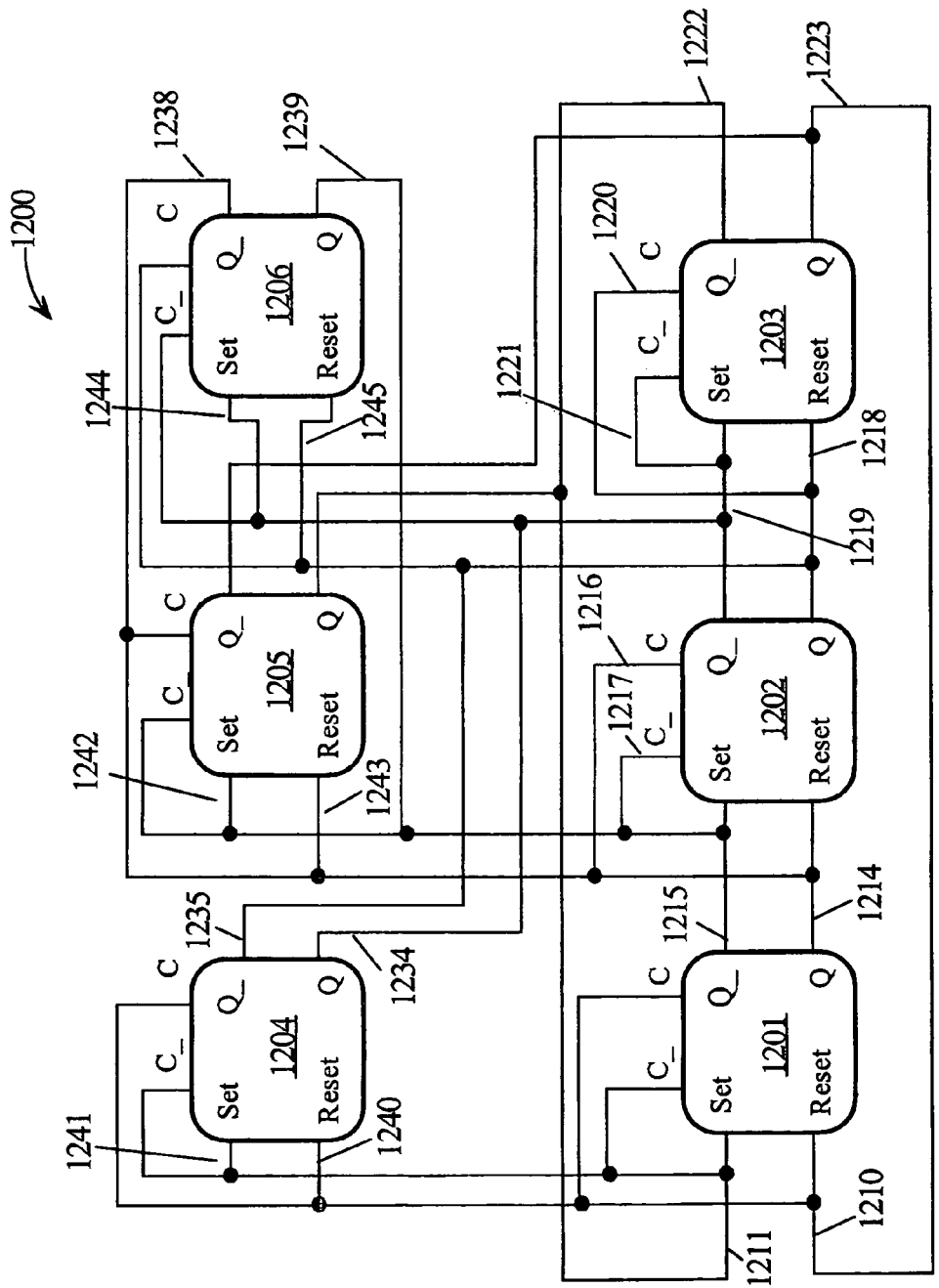
FIG. 11A is a circuit diagram of a high frequency ring oscillator according to embodiments of the present invention using series coupled latch circuits and feed-forward latch circuits of FIG. 8B or FIG. 9B.

FIG. 11A is a circuit diagram of a high frequency ring oscillator 1200 using series coupled latches of FIG. 3A as latches 1201–1203 and feed-forward latches 1204–1206. The primary path comprising latches 1201–1203 operates as discussed relative to the ring oscillator of FIG. 3B. Additionally, the feed-forward latches 1204–1206 are coupled such that each latch spans an inverting path. For example, if Reset 1210 transitions to a logic one, Q_1215 transitions to a logic one setting latch 1202 causing Q_1219 to transition to a logic zero. The Reset 1240 and corresponding Q 1234 spans from Reset 1210 to the Q_1219. When Reset 1240 transitions to a logic one, Q 1234 transitions to a logic zero forming an inverting path that spans from Reset 1210 to Q_1219. Likewise, when Set 1211 transitions to a logic one, Q 1214 transitions to a logic one resetting latch 1202 causing Q 1218 of latch 1202 to transition to a logic zero, again an inverting path. Set 1241 and corresponding Q_1235 spans from Set 1211 to Q_1218. When Set 1241 transitions to a logic one, Q_1235 transitions to a logic zero forming an inverting path that spans from Set 1211 to Q 1218. Feed-forward latches 1205 and 1206 can also be shown to span forward inverting paths. The ring oscillator 1200 of FIG. 11A operates in the same fashion as the ring oscillator of FIG. 2B except it does so with true differential signaling. The outputs 1222 and 1223 couple back to inputs 1211 and 1210, respectively.

Figure 11B:
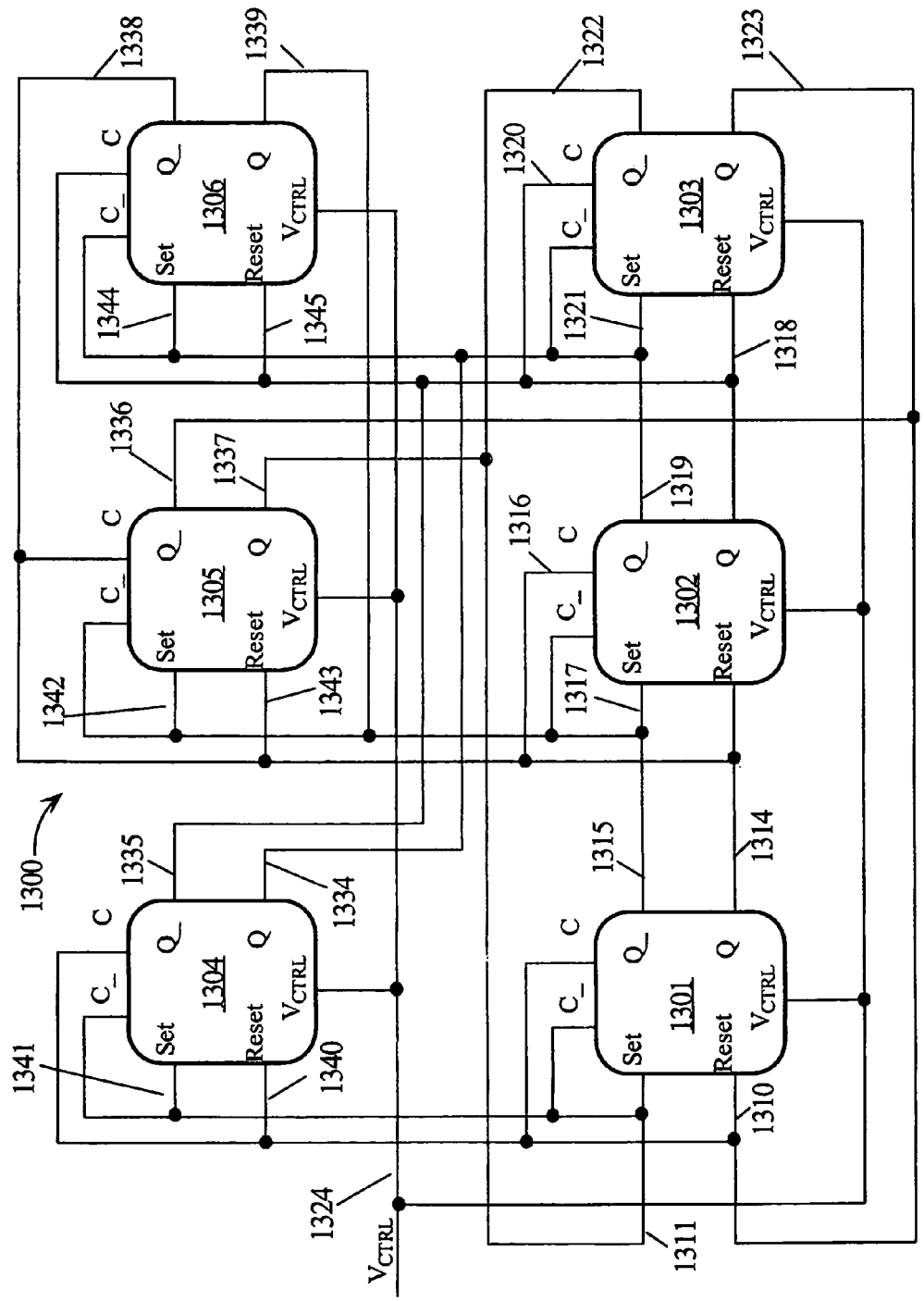
FIG. 11B is a circuit diagram of a high frequency VC ring oscillator according to embodiments of the present invention using voltage controlled series coupled latch circuits and voltage controlled feed-forward latch circuits of FIG. 5B or FIG. 6C.

FIG. 11B is a circuit diagram of a VC high frequency ring oscillator 1300 using series coupled VC latches of FIG. 5B or 6B as VC latches 1301–1303 and feed-forward VC latches 1304–1306. The primary path comprising VC latches 1301–1303 operates as discussed relative to the ring oscillator of FIG. 5B. Additionally, the feed-forward VC latches 1304–1306 are coupled such that each VC latch spans an inverting path. For example, if Reset 1310 transitions to a logic one, Q_1315 transitions to a logic one setting VC latch 1302 causing Q_1319 to transition to a logic zero. The Reset 1340 and corresponding Q 1334 spans from Reset 1310 to the Q_1319. When Reset 1340 transitions to a logic one, Q 1334 transitions to a logic zero forming an inverting path that spans from Reset 1310 to Q_1319. Likewise, when Set 1311 transitions to a logic one, Q 1314 transitions to a logic one resetting VC latch 1302 causing Q 1318 of VC latch 1302 to transition to a logic zero, again an inverting path. Set 1341 and corresponding Q_1335 spans from Set 1311 to Q_1318. When Set 1341 transitions to a logic one, Q_1335 transitions to a logic zero forming an inverting path that spans from Set 1311 to Q 1318. Feed-forward VC latches 1305 and 1306 can also be shown to span forward inverting paths. The ring oscillator 1300 of FIG. 11A operates in the same fashion as the ring oscillator of FIG. 2B except it does so with true differential signaling. The outputs 1322 and 1323 couple back to inputs 1311 and 1310 respectively. Each VC latch 1301–1306 is coupled to control voltage $V_{CTRL}$ 1324. When control voltage $V_{CTRL}$ 1324 is varied, the delay through the voltage controlled primary and parallel paths vary thus modulating the frequency of the ring oscillator 1300.

Figure 7:
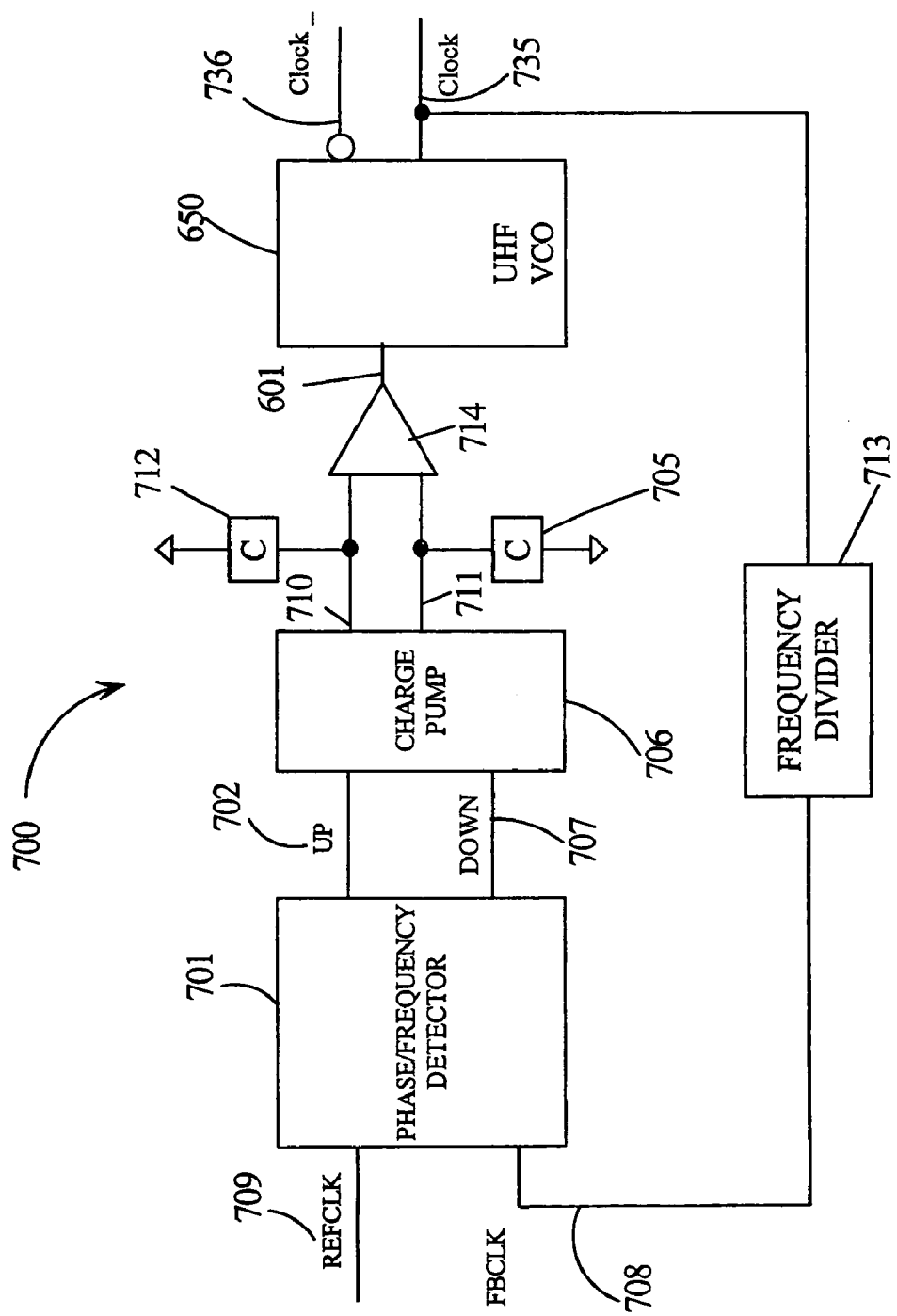
FIG. 7 is a circuit block diagram of a PLL suitable for practicing the principles of the present invention.

FIG. 7 is a block diagram of a representative phase lock loop circuit 700 suitable for practicing the principles of the present invention. Reference clock (RCLK) 709 and feedback clock (FBCLK) 708 are compared in phase/frequency detector (PFD) 701 generating UP signal 702 and DOWN signal 707 which are applied as control signals to charge pump 706. UP signal 702 and DOWN signal 707 are used to control current sources in charge pump 706. Charge pump 706 has charge pump nodes 710 and 711. Capacitor 712 is coupled between charge pump node 711 and ground and capacitor 705 is coupled between charge pump node 711 and ground. UP signal 702 and DOWN 707 are generated in response to a lead or lag phase difference between RCLK 709 and FBCLK 708. Since RCLK 709 and FBCLK 708 cannot concurrently have a lead and a lag phase error, UP signal 702 and DOWN 707 are mutually exclusive signals. Exemplary UHF VCO 650 (See FIGS. 6A–6C) produces a clock signal 735 and a complementary non-skewed clock signal 736 according to embodiments of the present invention. One of the clock signals (e.g., Clock 735) is frequency divided by frequency divider 713 generating FBCLK 708. UHF VCO 650 has voltage controlled frequency using the embodiment of FIG. 5A or FIG. 6B. The differential signal between charge pump nodes 710 and 711 is converted to an exemplary single ended control voltage 601 with amplifier 714 to control the frequency of UHF VCO 650 within a frequency range.

Although the method, system and computer program product are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims. It is noted that the headings are used only for organizational purposes and not meant to limit the scope of the description or claims.

What is claimed is:

1. A ring oscillator comprising:
   first and second parallel logic circuit paths each having a series connection of a number N inverting logic gates numbered 1 through N each with first and second inputs and an output, wherein in each logic path the output of each inverting logic gate number P of the N inverting logic gates is coupled to the first input of a corresponding inverting logic gate number P+1 and the output of each inverting logic gate number N is coupled to the first input of each inverting logic gate number 1 and the output of each logic gate P of the first logic circuit path is coupled to the second input of a corresponding logic gate P of the second logic circuit path and the output of each logic gate P of the second logic circuit path is coupled to the second input of a corresponding logic gate P of the first logic circuit path, the first path generating a clock signal and the second path generating a substantially non-skewed complement of the clock signal,
   wherein a delay through each of the N inverting logic gates is variable in response to a control voltage, thereby enabling a frequency of the ring oscillator to be varied and the delay through each of the N inverting logic stages is varied by modifying a conductance of a coupling device providing the series connection of the N inverting logic gates in response to the control voltage.

2. The ring oscillator of claim 1, wherein the delay through each of the N inverting logic stages is varied by modifying a current drive of the N inverting logic gates in response to the control voltage.

3. The ring oscillator of claim 1, wherein each of the N inverting logic gates comprises:
   a logic stage that asserts a first logic state on the output in response to a second logic state asserted on either the first or second input; and
   an active load device having an input node coupled to a source of current, an output node coupled to the output, and a gate node that is coupled to another output of a particular one of the N inverting logic gates in the first or second logic path that asserts a logic state complementary to and lagging in time a logic state asserted on the output coupled to the active load device, wherein the active load device couples the source of current to the output when the first logic state is asserted on the gate node.

4. The ring oscillator of claim 3, wherein the source of current comprises:
   a first field effect transistor (FET) having a drain electrode coupled to the input node of the active load, a source electrode coupled to a first voltage potential of a power supply, and a gate electrode coupled to a second voltage potential of the power supply; and
   a second FET coupled in parallel with the first FET and having a drain electrode coupled to the input node of the active load, a gate electrode coupled to a control input and a source electrode coupled to the second voltage potential of the power supply, wherein the current coupled to the input node of the active load is varied in response to a control voltage applied to the control input to vary a delay through each of the N inverting logic gates and thereby varying the frequency of the ring oscillator.

5. The ring oscillator of claim 3, wherein the logic stage comprises:
   a first FET having a gate electrode coupled to the first input, a source electrode coupled to a first voltage potential of a power supply and a drain electrode coupled to the output; and
   a second FET having a gate electrode coupled to the second input, a source electrode coupled to the first voltage potential of the power supply and a drain electrode coupled to the drain electrode of the first FET.

6. The ring oscillator of claim 4, wherein the first FET is a PFET and the second FET is a PFET substantially larger than the first FET.

7. The ring oscillator of claim 6, wherein the first FET is an NFET, the second FET is an NFET and the third FET is a PFET.

8. The ring oscillator of claim 1, wherein the coupling device is a bi-directional pass gate coupled in series with the output of each of the N inverting logic gates, the bi-directional pass gate having a control node for varying the conductance of the bi-directional pass gate in response to a control signal applied to the control node thereby varying the delay through each of the N inverting logic gates and thus the frequency of the ring oscillator.

9. The ring oscillator of claim 1 further comprising N feed-forward (FF) circuits each having a first inverting FF logic stage between a first input and a first output and a second inverting FF logic stage between a second input and a second output, wherein the first input of each FF circuit P of the N FF circuits is coupled to an output K of one of the N logic gates of the ring oscillator, the second input of each FF circuit P of the N FF circuits is coupled to an output that is in phase and a complement of the output K, the first output of each FF circuit P of the N FF circuits is coupled to an output J that is the logic complement of output K and delayed from output K, and the second output of each FF circuit P of the N FF circuits is coupled to an output that is the complement of output J, further wherein each output of the N logic gates is coupled to only one first or second input and one first or second output.

10. The ring oscillator of claim 9, wherein each of the N FF circuits comprise a first inverter having an input coupled to the first input and an output coupled to the first output and a second inverter having an input coupled to the second input and an output coupled to the second output.

11. The ring oscillator of claim 10, wherein each of the N FF circuits comprise first and second inverting logic gates each having a first and second input and an output, the second input of the first inverting logic gate coupled to the output of the second inverting logic gate and the second input of the second inverting logic gate coupled to the output of the first inverting logic gate, wherein the first input of the first inverting logic gate is the first input of the first inverting FF logic stage and the output of the first inverting logic gate is the first output of the first inverting FF logic stage and the first input of the second inverting logic gate is the second input of the second inverting FF logic stage and the output of the second inverting logic gate is the second output of the second inverting FF logic stage.

12. The ring oscillator of claim 11, wherein a delay through each of the N FF circuits is varied by modifying a current drive of the N FF circuits in response to a control voltage, thereby enabling a frequency of the ring oscillator to be varied.

13. The ring oscillator of claim 12, wherein the first and second inverter comprise a series coupled PFET and NFET, the PFET having a gate electrode coupled to the control voltage, a source electrode coupled to a first power supply voltage potential and a drain electrode coupled to a corresponding one of the first or second output and the NFET having a drain electrode coupled to the drain electrode of the PFET, a gate electrode coupled to a corresponding one of the first or second input and a source electrode coupled to a second power supply voltage potential.

14. The ring oscillator of claim 11, wherein a delay through each of the N FF circuits is varied by modifying a current drive of the N FF circuits in response to a control voltage, thereby enabling a frequency of the ring oscillator to be varied.

15. The ring oscillator of claim 14, wherein each of the first and second inverting logic gates comprises:
   a logic stage that asserts a first logic state on the output in response to a second logic state asserted on either of the first or second inputs; and
   an active load device having a gate node coupled to the first input, an input node coupled to a source of current, and an output node coupled to the output, wherein the active load device couples the source of current to the output when the first logic state is asserted on the gate node.

16. The ring oscillator of claim 15, wherein the source of current comprises:
   a first FET having a drain electrode coupled to the input node of the active load, a source electrode coupled to a first voltage potential of a power supply, and a gate electrode coupled to a second voltage potential of the power supply; and
   a second FET in parallel with the first FET and having a drain electrode coupled to the input node of the active load, a gate electrode coupled to a control input and a source electrode coupled to the second voltage potential of the power supply, wherein the current coupled to the second node of the active load is varied in response to a control voltage applied to the control input to vary a delay through each of the N inverting logic gates and thereby varying the frequency of the ring oscillator.

17. The ring oscillator of claim 15, wherein the logic stage comprises:
   a first FET having a gate electrode coupled to the first input, a source electrode coupled to a first voltage potential of a power supply and a drain electrode coupled to the output; and
   a second FET having a gate electrode coupled to the second input, a source electrode coupled to the first voltage potential of the power supply and a drain electrode coupled to the drain electrode of the first FET.

18. The ring oscillator of claim 17, wherein the active load device comprises a third FET having a gate electrode coupled to the first input, a source electrode coupled to the source of current, and a drain electrode coupled to the output.

19. The ring oscillator of claim 16, wherein the first FET is a PFET and the second FET is a PFET substantially larger than the first FET.

20. The ring oscillator of claim 17, wherein the first FET is an NFET, the second FET is an NFET and the third FET is a PFET.

21. A phase locked loop (PLL) circuit for generating a clock signal and a substantially non-skewed complementary clock signal of the same frequency that is a multiple number M times the frequency of a reference clock signal, comprising:
   an ultra high frequency (UHF) voltage controlled oscillator (VCO) generating the clock signal and non-skewed complementary clock signal with a frequency modified in response to a control voltage;
   a frequency divider for frequency dividing the clock signal or the complementary clock signal by M, generating a frequency divided clock signal;
   a phase frequency detector for comparing the frequency divided clock signal to the reference clock signal and generating a phase/frequency error signal; and
   circuitry for converting the phase/frequency error signal to the control voltage, wherein the ultra high frequency VCO is a ring oscillator with first and second parallel logic circuit paths each with a same delay variable in response to the control voltage and each having a series connection of a number N inverting logic gates numbered 1 through N each with first and second inputs and an output, wherein the output of each inverting logic gate number P of the N inverting logic gates in each logic path is coupled to the first input of a corresponding inverting logic gate number P+1 and the output of each inverting logic gate number N is coupled to the first input of each inverting logic gate number 1 and the output of each logic gate P of the first logic circuit path is coupled to the second input of a corresponding logic gate P of the second logic circuit path and the output of each logic gate P of the second logic circuit path is coupled to the second input of a corresponding logic gate P of the first logic circuit path, the first path generating a clock signal and the second path generating a substantially non-skewed complement of the clock signal, and circuitry with a common control input coupled to each of the N inverting logic gates in the first and second parallel logic paths for varying the delay of the N inverting logic gates in response to the control signal coupled to the common control input and thus the frequency of the ultra high frequency VCO, each of the N inverting logic gates further comprising:
- a logic stage that asserts a first logic state on the output in response to a second logic state asserted on either of the first or second inputs; and
- an active load device having an input node coupled to a source of current, an output node coupled to the output, and a gate node that is coupled to another output of a particular one of the N inverting logic gates in the first or second logic path that asserts a logic state complementary to and lagging in time a logic state asserted on the output coupled to the active load device, wherein the active load device couples the source of current to the output when the first logic state is asserted on the gate node.

22. The PLL circuit of claim 21, wherein the delay through each of the N inverting logic stages is varied by modifying a current drive of the N inverting logic gates in response to the control voltage.

23. The PLL circuit of claim 21, wherein the source of current comprises:
- a first FET having a drain electrode coupled to the input node of the active load, a source electrode coupled to a first voltage potential of a power supply, and a gate electrode coupled to a second voltage potential of the power supply; and
- a second FET in parallel with the first FET and having a drain electrode coupled to the input node of the active load, a gate electrode coupled to a control input and a source electrode coupled to the second voltage potential of the power supply, wherein the current coupled to the second node of the active load is varied in response to a control voltage applied to the control input to vary a delay through each of the N inverting logic gates and thereby varying the frequency of the ring oscillator.

24. The PLL circuit of claim 21, wherein the logic stage comprises:
- a first FET having a gate electrode coupled to the first input, a source electrode coupled to a first voltage potential of a power supply and a drain electrode coupled to the output; and
- a second FET having a gate electrode coupled to the second input, a source electrode coupled to the first voltage potential of the power supply and a drain electrode coupled to the drain electrode of the first FET.

25. The PLL circuit of claim 24, wherein the active load device comprises a third FET having a gate electrode coupled to the first input, a source electrode coupled to the source of current, and a drain electrode coupled to the output.

26. The PLL circuit of claim 23, wherein the first FET is a PFET and the second FET is a PFET substantially larger than the first FET.

27. The PLL circuit of claim 24, wherein the first FET is an NFET, the second FET is an NFET and the third FET is a PFET.

28. The PLL circuit of claim 21 further comprising N feed-forward (FF) circuits each having a first inverting FF logic stage between a first input and a first output and a second inverting FF logic stage between a second input and a second output, wherein the first input of each FF circuit P of the N FF circuits is coupled to an output K of one of the N logic gates of the ring oscillator, the second input of each FF circuit P of the N FF circuits is coupled to an output that is in phase and a complement of the output K, the first output of each FF circuit P of the N FF circuits is coupled to an output J that is the logic complement of output K and delayed from output K, and the second output of each FF circuit P of the N FF circuits is coupled to an output that is the complement of output J, further wherein each output of the N logic gates is coupled to only one first or second input and one first or second output.

29. The PLL circuit of claim 28, wherein each of the N FF circuits comprise first and second inverting logic gates each having a first and second input and an output, the second input of the first inverting logic gate coupled to the output of the second inverting logic gate and the second input of the second inverting logic gate coupled to the output of the first inverting logic gate, wherein the first input of the first inverting logic gate is the first input of the first inverting FF logic stage and the output of the first inverting logic gate is the first output of the first inverting FF logic stage and the first input of the second inverting logic gate is the second input of the second inverting FF logic stage and the output of the second inverting logic gate is the second output of the second inverting FF logic stage.

30. The PLL circuit of claim 29, wherein a delay through each of the N FF circuits is varied by modifying a current drive of the N FF circuits in response to a control voltage, thereby enabling a frequency of the ring oscillator to be varied.

31. The PLL circuit of claim 30, wherein each of the first and second inverting logic gates comprises:
- a logic stage that asserts a first logic state on the output in response to a second logic state asserted on either of the first or second inputs; and
- an active load device having a gate node coupled to the first input, an input node coupled to a source of current, and an output node coupled to the output, wherein the active load device couples the source of current to the output when the first logic state is asserted on the gate node.

32. The PLL circuit of claim 31, wherein the source of current comprises:
- a first FET having a drain electrode coupled to the input node of the active load, a source electrode coupled to a first voltage potential of a power supply, and a gate electrode coupled to a second voltage potential of the power supply; and
- a second FET in parallel with the first FET and having a drain electrode coupled to the input node of the active load, a gate electrode coupled to a control input and a source electrode coupled to the second voltage potential of the power supply, wherein the current coupled to the second node of the active load is varied in response to a control voltage applied to the control input to vary a delay through each of the N inverting logic gates and thereby varying the frequency of the ring oscillator.

* * * * *